(12) United States Patent
Okada

(10) Patent No.: US 8,274,057 B2
(45) Date of Patent: Sep. 25, 2012

(54) DETECTION ELEMENT

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 759 days.

(21) Appl. No.: 12/486,768

(22) Filed: Jun. 18, 2009

(65) Prior Publication Data
US 2009/0322719 A1    Dec. 31, 2009

(30) Foreign Application Priority Data

Jun. 27, 2008   (JP) ................................. 2008-168975

(51) Int. Cl.
*G06F 3/038* (2006.01)
(52) U.S. Cl. ......... 250/370.09; 250/370.11; 250/390.11; 250/336.1; 345/207
(58) Field of Classification Search .............. 250/390.11
See application file for complete search history.

(56) References Cited

U.S. PATENT DOCUMENTS

| | | | | |
|---|---|---|---|---|
| 5,198,673 A * | 3/1993 | Rougeot et al. | .......... | 250/370.11 |
| 5,418,634 A * | 5/1995 | Kanbe et al. | .................... | 349/37 |
| 5,589,796 A * | 12/1996 | Alberth et al. | ................. | 330/133 |
| 5,852,296 A * | 12/1998 | Tsukamoto et al. | ..... | 250/370.09 |
| 6,353,229 B1 * | 3/2002 | Polischuk et al. | ........ | 250/370.14 |
| 6,403,965 B1 * | 6/2002 | Ikeda et al. | .............. | 250/370.09 |
| 6,507,026 B2 * | 1/2003 | Ikeda et al. | .............. | 250/370.09 |
| 6,855,935 B2 * | 2/2005 | Morishita | ................. | 250/370.09 |
| 6,870,229 B2 * | 3/2005 | Dessard et al. | ............... | 257/360 |
| 6,894,283 B1 * | 5/2005 | Busse et al. | .............. | 250/370.09 |
| 7,532,209 B2 * | 5/2009 | Kimura | ......................... | 345/205 |
| 2001/0012219 A1 * | 8/2001 | Lee et al. | ................. | 365/189.09 |
| 2008/0224983 A1 * | 9/2008 | Lee et al. | ......................... | 345/98 |
| 2008/0246544 A1 * | 10/2008 | Fujino et al. | .................. | 330/278 |
| 2009/0008532 A1 * | 1/2009 | Setoguchi | .................. | 250/208.1 |
| 2009/0032824 A1 * | 2/2009 | Suzumura et al. | .............. | 257/84 |
| 2010/0084562 A1 * | 4/2010 | Angell et al. | ............ | 250/363.01 |

FOREIGN PATENT DOCUMENTS

JP   2001-345440 A   12/2001

OTHER PUBLICATIONS

Proceedings of SPIE vol. 4682 (2002), pp. 819-827.

* cited by examiner

*Primary Examiner* — David Porta
*Assistant Examiner* — Djura Malevic
(74) *Attorney, Agent, or Firm* — Solaris Intellectual Property Group, PLLC

(57) ABSTRACT

The present invention provides a detection element that can suppress generation of a residual image. A sensor portion includes a semiconductor layer, an upper electrode and a lower electrode. The semiconductor layer generates charges due to light being illuminated thereto. The upper electrode applies a bias voltage to the semiconductor layer. The lower electrode collects charges that have been generated at the semiconductor layer. The charges that have been generated at the semiconductor layer are collected and accumulated by the lower electrode. In the detection element, a saturation prevention circuit (diode and second bias line) is provided through which the accumulated charges flow-out when the charges that have been generated at the semiconductor layer are collected and a voltage level of the lower electrode becomes a saturation prevention voltage level Vs.

18 Claims, 15 Drawing Sheets

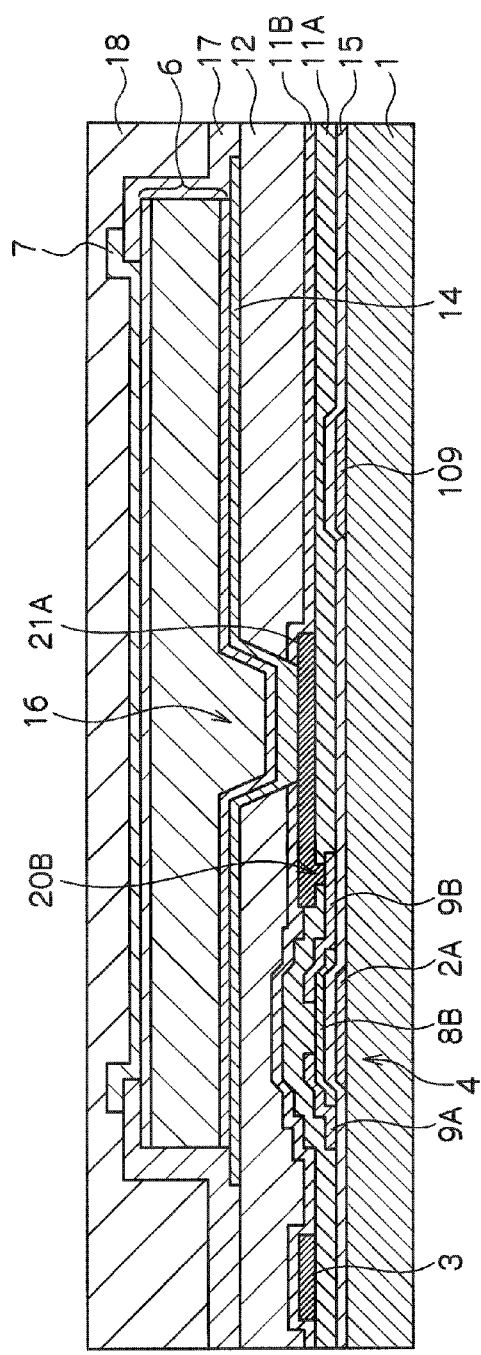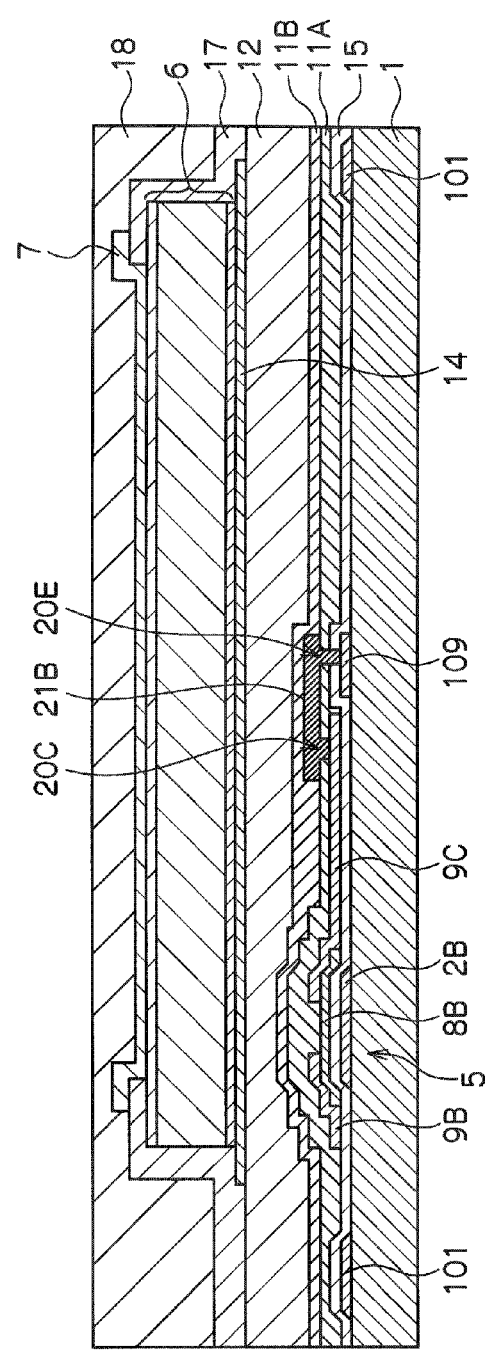

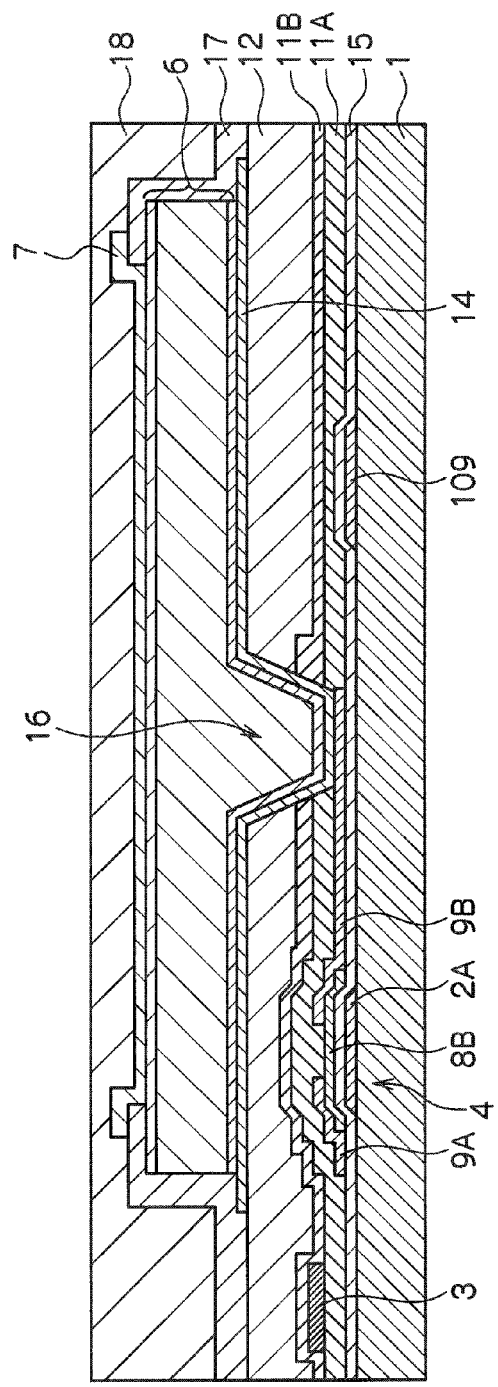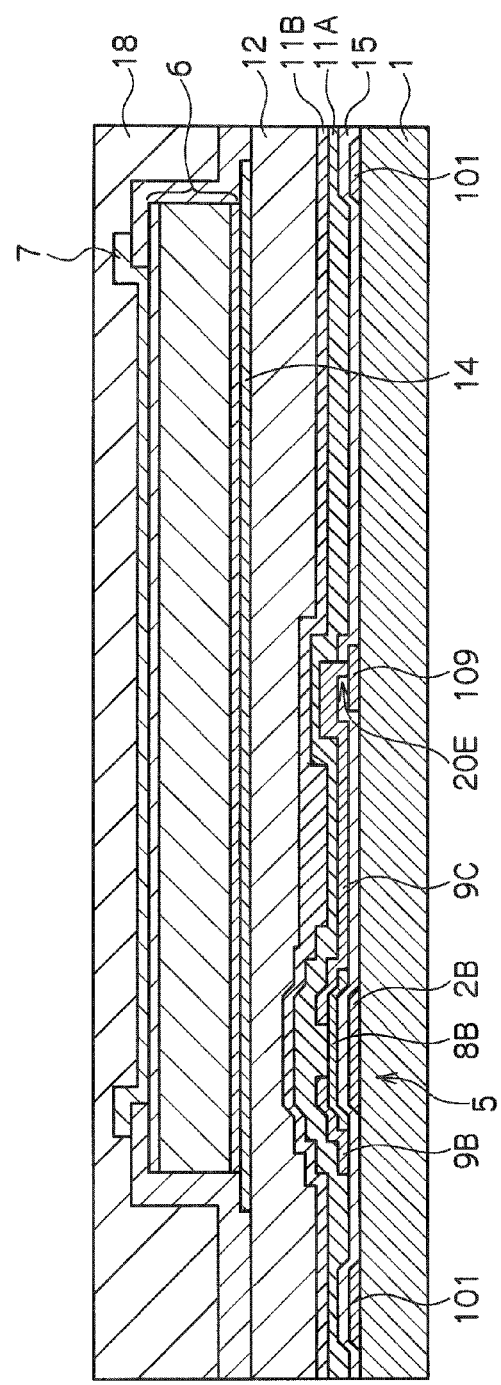

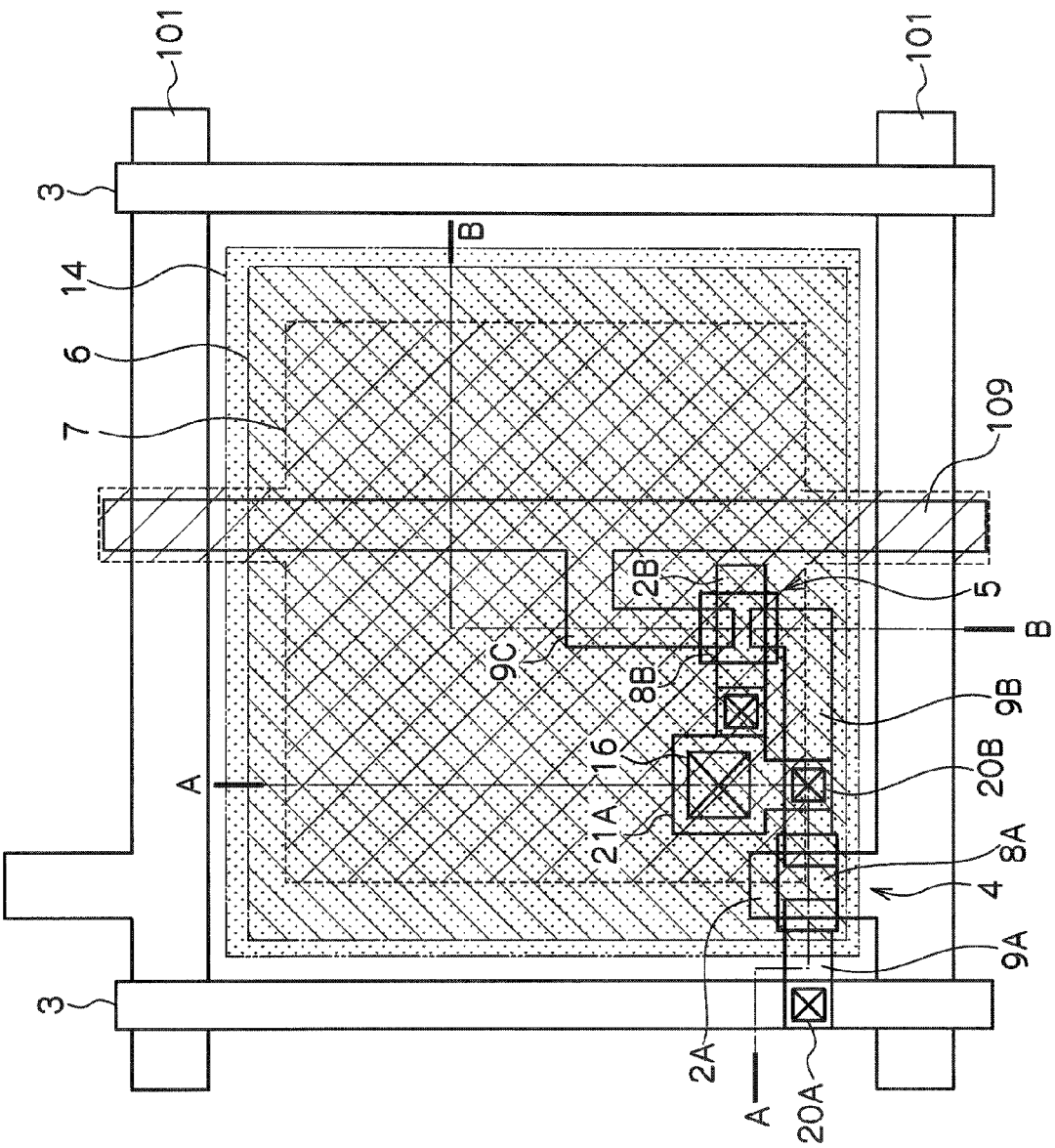

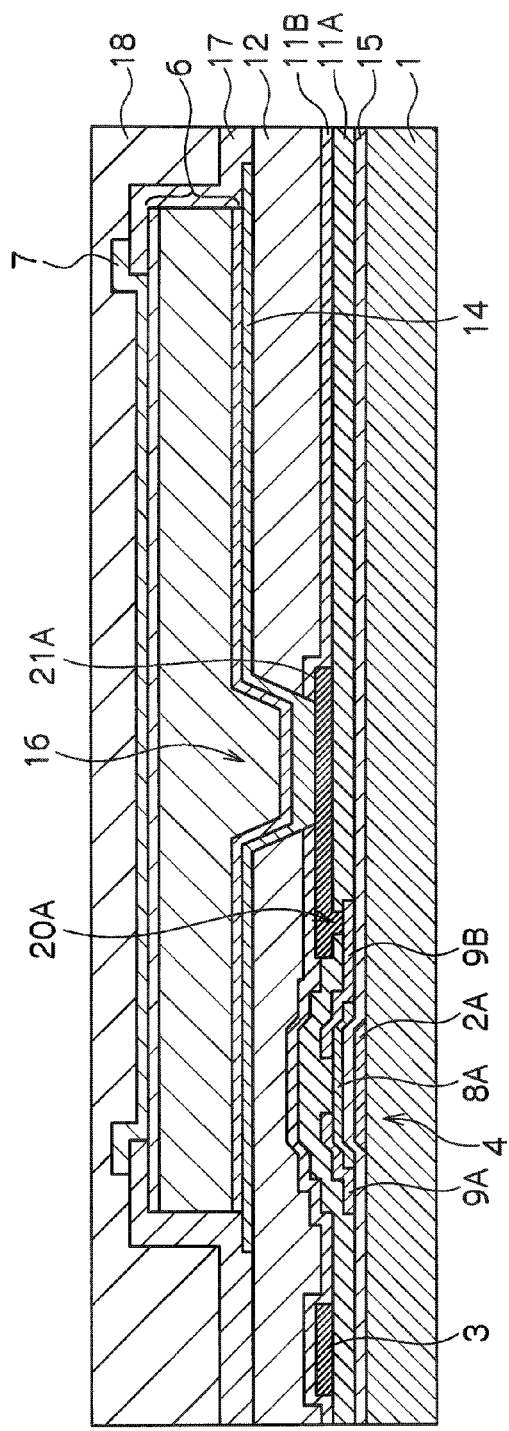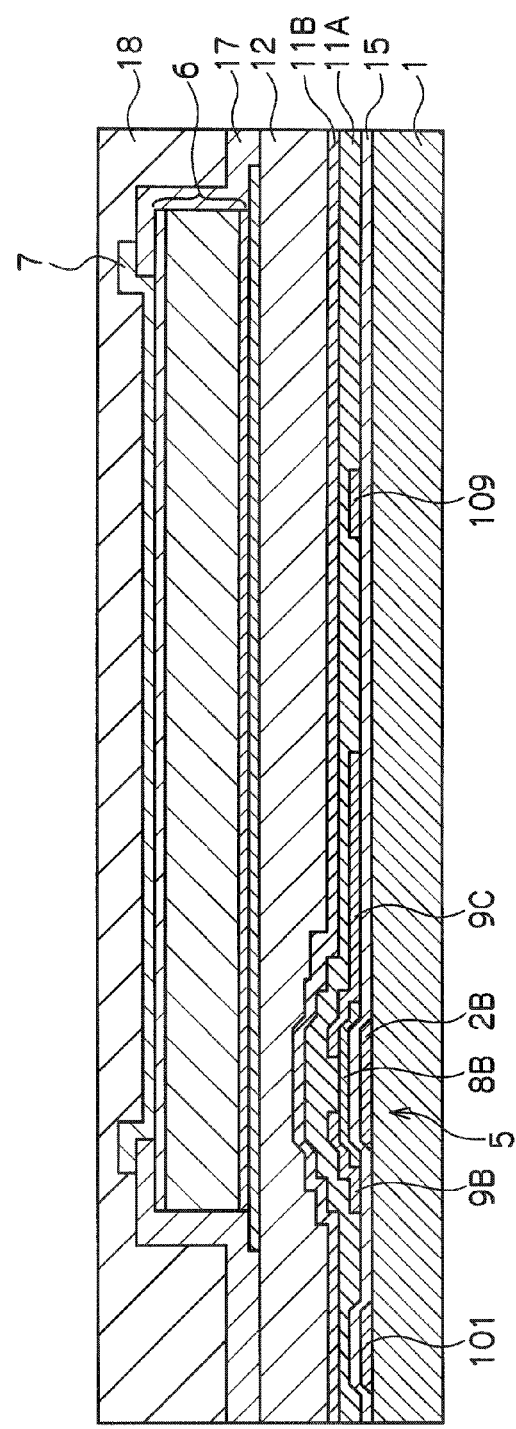
FIG. 13A
FIG. 13B

DETECTION ELEMENT

CROSS-REFERENCE TO RELATED APPLICATION

This application claims priority under 35 USC 119 from Japanese Patent Application No. 2008-168975, the disclosure of which is incorporated by reference herein.

BACKGROUND OF THE INVENTION

1. Field of the Invention

The present invention relates to a detection element. In particular, the present invention relates to a detection element that accumulates charges generated due to radiation being irradiated and detects an accumulated charge amount as information expressing an image.

2. Description of the Related Art

A detection element, such as an FPD (flat panel detector) or the like, in which an X-ray sensitive layer is disposed on a TFT (thin film transistor) active matrix substrate, and that can convert X-ray information directly to digital data, has been put into practice in recent years. As compared with a conventional imaging plate, an image can be confirmed immediately at an FPD. Further, the FPD has the advantage that video images as well can be confirmed. Therefore, the popularization of FPDs has advanced rapidly.

Various types of detection elements are proposed. For example, there is a direct-conversion-type detection element that converts radiation directly into charges in a semiconductor layer, and accumulates the charges. Moreover, there is an indirect-conversion-type detection element that once converts radiation into light at a scintillator of CsI:T1, GOS (Gd2O2S:Tb), or the like, and, at semiconductor layer, converts the converted light into charges and accumulates the charges.

In this kind of detection element, an electrode (hereinafter referred to as a "bias electrode") that applies a bias voltage to one surface of the semiconductor layer and an electrode (hereinafter referred to as a "collecting electrode") that collects charges at the other surface of the semiconductor layer are provided. In this kind of detection element, charges generated at the semiconductor layer are collected at the collecting electrode and are accumulated as information expressing an image.

In this kind of detection element, a voltage level of the collecting electrode changes in accordance with a charge amount of the accumulated charges.

For example, in a case where a positive bias voltage is applied from the bias electrode to the semiconductor layer, negative charges that have been generated at the semiconductor layer moves to the bias electrode. Further, positive charges that have been generated at the semiconductor layer moves to the collecting electrode.

For this reason, the larger the amount of charges that have been collected and accumulated becomes, the more a voltage level of the collecting electrode increases. As a result, a potential difference between the bias electrode and the collecting electrode decreases.

In this kind of detection electrode, when the potential difference between the bias electrode and the collecting electrode decreases, charges generated at the semiconductor layer are trapped by a defect level at the semiconductor layer interior and remain therein without moving. Accordingly, in a case where it is attempted to continuously read out images to obtain video images, a residual image may be generated.

In particular, in an indirect-conversion-type detection element, amorphous silicon or the like is used as the semiconductor layer. In the indirect-conversion-type detection element, the semiconductor layer is thin, and a bias voltage that is applied to the semiconductor layer is generally as low as from several volts to several tens of volts. As a result, in the indirect-conversion-type detection element, such a phenomenon may be easily generated.

As a technique for suppressing generation of a residual image, Japanese Patent Application Laid-Open (JP-A) No. 2001-345440 discloses a technique of providing a TFT switch for resetting for each of the respective pixels of a detection element, and driving the TFT switches for resetting immediately before X-rays are irradiated, to eliminate charges remaining within the respective pixels.

Further, *Proc. SPIE*, Vol. 4682, pp. 820-821 discloses a technique of making it difficult to recognize a residual image, by illuminating light from a backlight to a detection element immediately before X-rays are irradiated, and evenly filling in defect levels at the interior of a semiconductor layer with charges to reduce variation in the remanence of charges per pixel.

However, in the techniques disclosed in JP-A No. 2001-345440 and *Proc. SPIE*, Vol. 4682, pp. 820-821, it is necessary to drive the TFT switches for resetting or illuminate light from the backlight, immediately before X-rays are irradiated. Accordingly, in cases where it has been attempted to continuously read out radiographic images from a detection element to obtain video images, there has been a limit to the improvement of a frame rate.

Further, the techniques disclosed in JP-A No. 2001-345440 and *Proc. SPIE*, Vol. 4682, pp. 820-821, are techniques for suppressing the influence of a residual image that has been generated. Accordingly, these techniques cannot suppress the generation, per se, of a residual image.

SUMMARY OF THE INVENTION

The present invention provides a detection element that can suppress generation of a residual image.

A first aspect of the present invention is detection element including: a light emitting layer that emits light due to radiation being irradiated thereto; a semiconductor layer that generates charges due to incident light from the light emitting layer; a first electrode that applies a bias voltage to the semiconductor layer; a second electrode that collects charges generated at the semiconductor layer, and in which a voltage level changes so that a potential difference between the second electrode and the first electrode decreases when a charge amount of charges collected and accumulated increases; and a saturation prevention circuit connected to the second electrode, and through which the accumulated charges flow when the voltage level of the second electrode reaches a predetermined saturation prevention voltage level having the same polarity as the bias voltage and having an absolute value of the voltage level smaller than the voltage level of the bias voltage.

A second aspect of the present invention is a detection element including: a semiconductor layer that is formed with amorphous silicon as a main constituent thereof and generates charges due to incident light; a first electrode that applies a bias voltage to the semiconductor layer; a second electrode that collects charges generated at the semiconductor layer, and in which a voltage level changes so that a potential difference between the second electrode and the first electrode decreases when a charge amount of charges collected and accumulated increases; and a saturation prevention circuit connected to the second electrode, and through which the accumulated charges flow when the voltage level of the second electrode becomes a predetermined saturation prevention voltage level having the same polarity as the bias voltage and having an absolute value of the voltage level smaller than the voltage of the bias voltage.

In the detection element of the first aspect of the present invention, due to radiation being irradiated thereto, the light emitting layer emits light, the light from the light emitting layer is illuminated to the semiconductor layer, and charges are generated at the semiconductor layer.

On the other hand, in the detection element of the second aspect of the present invention, the semiconductor layer is formed with amorphous silicon as a main constituent thereof, and due to the light illuminated to the semiconductor layer, charges are generated at the semiconductor layer.

Further, in the first aspect and the second aspect, a bias voltage is applied to the semiconductor layer by the first electrode, and charges generated at the semiconductor layer are collected by the second electrode. In the first aspect and the second aspect, a voltage level of the second electrode changes so that, the larger a charge amount of charges that have been collected and accumulated becomes, the smaller a potential difference between the first electrode and the second electrode becomes.

Furthermore, in the first aspect and the second aspect, a configuration is provided in which the accumulated charges flow through the saturation prevention circuit connected to the second electrode when the voltage level of the second electrode becomes the predetermined saturation prevention voltage level that is the same polarity as the bias voltage and at which an absolute value of the voltage level is smaller than the voltage level of the bias voltage.

In the detection element of the present invention, charges generated at the semiconductor layer are collected and accumulated by the second electrode. Further, in the detection element of the present invention, the saturation prevention circuit is provided that prevents the accumulated charges from flowing out when the charges that have been generated at the semiconductor layer are collected and the voltage level of the second electrode becomes the saturation prevention voltage level. For this reason, when a large amount of charges that have been generated at the semiconductor layer have been collected by the second electrode, the voltage level of the second electrode does not reach a saturation voltage at which trapping is generated at the semiconductor layer. As a result, the detection element of the present invention can suppress generation of a residual image.

In a third aspect of the present invention, in the above aspects, the detection element may further include: a signal line connected to the second electrode via a switch element, and through which an electrical signal corresponding to the accumulated charges flows in accordance with a switching state of the switch element; and an amplification circuit that amplifies the electrical signal that flows through the signal line, by using a predetermined reference voltage as a reference, wherein the saturation prevention voltage level may be a voltage level between the reference voltage and the bias voltage.

In a fourth aspect of the present invention, in the above aspects, the switch element may be a thin film transistor; and a potential difference between a gate of the thin film transistor and the second electrode increases when the accumulated charge amount increases.

In a fifth aspect of the present invention, in the above aspects, the saturation prevention circuit may include, a power line to which power at the saturation prevention voltage level is supplied; and a diode in which a cathode is connected to the power line, and an anode is connected to the second electrode.

In a sixth aspect of the present invention, in the above aspects, the diode may include a thin film transistor in which a gate and a drain are connected.

In a seventh aspect of the present invention, in the above aspects, the diode may be configured such that the gate and the drain of the thin film transistor are electrically connected by a first connection member; and the first connection member may be formed at a metal layer different from the gate and the drain of the thin film transistor and from the second electrode, and is at a downstream side, from the second electrode, with respect to the incident light.

In an eighth aspect of the present invention, in the above aspects, the first connection member may electrically connect the second electrode and the switch element.

In a ninth aspect of the present invention, in the above aspects, the power line and the cathode of the diode may be electrically connected by a second connection member formed at the same metal layer as the first connection member.

In a tenth aspect of the present invention, in the above aspects, the first connection member and the second connection member may be formed in a region where the second electrode is formed.

In this manner, according to the present invention, charges that have been generated at the semiconductor layer are collected and accumulated by the second electrode. Further, the saturation prevention circuit is provided through which the accumulated charges flows out when charges that have been generated at the semiconductor layer are collected and the voltage level of the second electrode has become the saturation prevention voltage level. Accordingly, the present invention can suppress generation of a residual image.

BRIEF DESCRIPTION OF THE DRAWINGS

Exemplary embodiments of the present invention will be described in detail based on the following figures, wherein:

FIG. 3A and FIG. 3B are cross-sectional views of one pixel unit of a detection element according to an exemplary embodiment;

FIG. 11A and FIG. 11B are cross-sectional views of one pixel unit of a detection element according to another exemplary embodiment;

FIG. 12 is a plan view showing a configuration of one pixel unit of a detection element according to another exemplary embodiment;

FIG. 13A and FIG. 13B are cross-sectional views of one pixel unit of a detection element according to another exemplary embodiment;

DETAILED DESCRIPTION OF THE INVENTION

Exemplary embodiments of the present invention will be explained below with reference to the drawings. It should be noted that, in the following, the present invention will be explained with respect to a radiographic image detection apparatus 100 using an indirect-conversion-type detection element.

Figure 1:
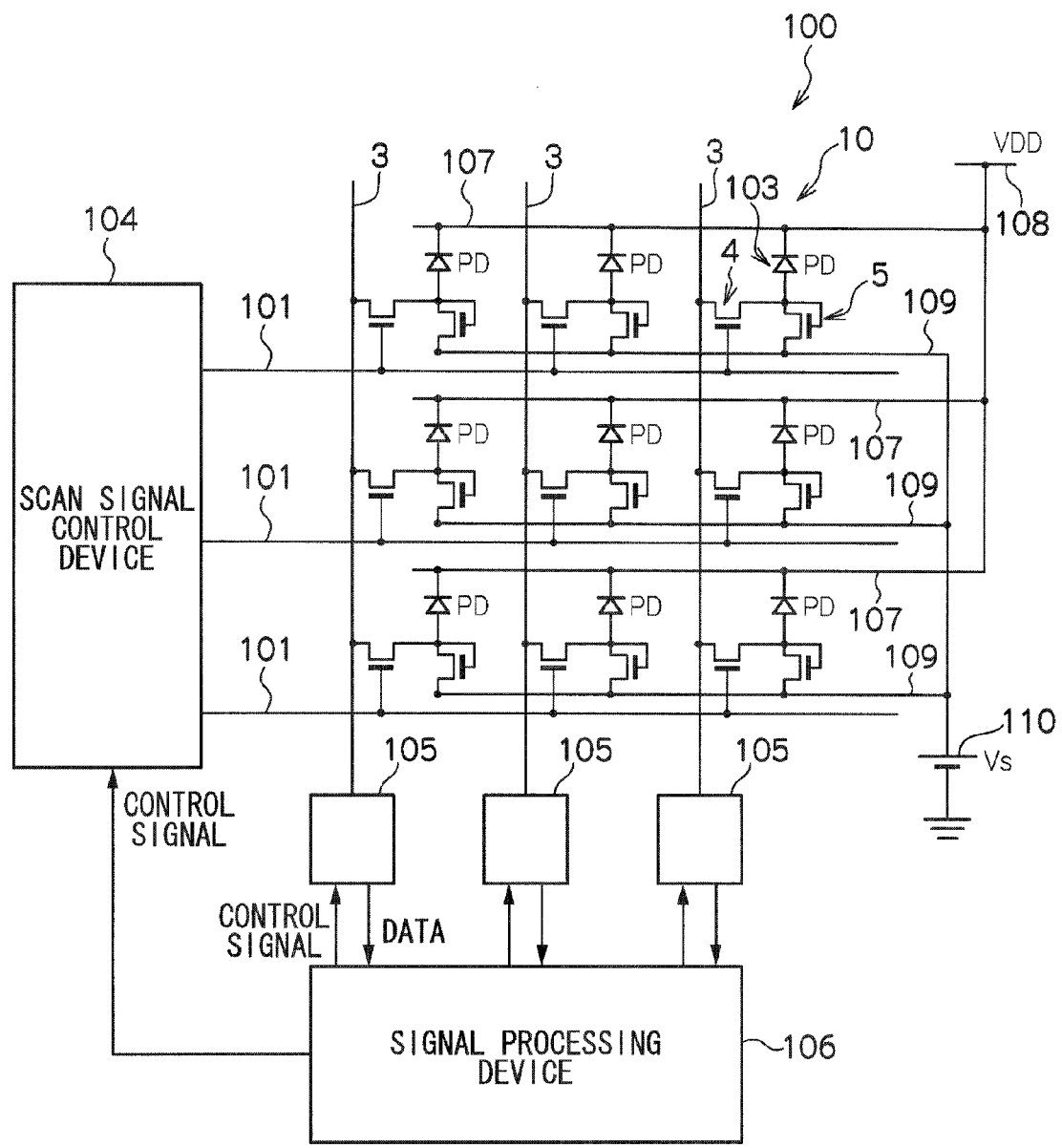
FIG. 1 is a schematic diagram showing an overall configuration of a radiographic image detection apparatus according to an exemplary embodiment.

In FIG. 1, an overall configuration of the radiographic image detection apparatus 100 according to the present exemplary embodiment is shown. However, a scintillator that converts radiation to light is omitted therefrom.

As shown in FIG. 1, the radiographic image detection apparatus 100 according to the present exemplary embodiment includes a detection element 10.

In the detection element 10, plural pixels, each including a sensor portion 103 and a TFT switch 4, are arranged two-dimensionally. The sensor portion 103 receives light to which irradiated radiation that has been converted at a scintillator, and accumulates charges. The TFT switch 4 reads out the charges accumulated at the sensor portion 103.

Each sensor portion 103 of the detection element 10 according to the present exemplary embodiment includes, a semiconductor layer that generates charges due to light being illuminated thereto, an electrode that applies a bias voltage to the semiconductor layer, and an electrode that collects charges generated at the semiconductor layer (detailed description thereof will be provided later). In FIG. 1 and in FIG. 5, FIG. 6 and FIG. 9 which will be described later, the sensor portions 103 are shown as a photodiode (PD). First bias lines 107 are connected to each sensor portion 103. The first bias lines 107 are connected to a power line 108 to which a bias voltage VDD is supplied.

Furthermore, a TFT switch 5 is further provided at each sensor portion 103. A gate and a drain of the TFT switch 5 are connected to each other, and are connected to the sensor portion 103 and the TFT switch 4. Further, a source of the TFT switch 5 is connected to a second bias line 109. The second bias lines 109 are connected to a power source 110 that outputs a predetermined saturation prevention voltage level Vs which is the same polarity as the bias voltage VDD and at which an absolute value of the voltage level is smaller than that of the bias voltage VDD.

Further, at the detection element 10, plural scan lines 101 and plural signal lines 3 are provided so as to cross each other. The scan lines 101 turn the aforementioned TFT switches 4 ON/OFF. The signal lines 3 read out the charges that have been accumulated at the sensor portions 103.

At each signal line 3, due to any of the TFT switches 4 that are connected to the signal line 3 being turned ON, an electrical signal corresponding to an amount of charges that have been accumulated at the sensor portion 103 flows. To each signal line 3, a signal detection circuit 105 that detects an electrical signal that has flowed out through the respective signal line 3 is connected. To each scan lines 101, a scan signal control device 104 that outputs a control signal to the respective scan lines 101 for turning the TFT switches 4 ON/OFF are connected.

The signal detection circuit 105 includes an amplification circuit that amplifies an inputted electrical signal, for each of the signal lines 3. The signal detection circuit 105 detects the electrical signal which is inputted by the respective signal line 3, and the electrical signal is amplified by the amplification circuit. Due thereto, the signal detection circuits 105 detects the amounts of charges accumulated at the respective sensor portions 103, as information of the respective pixels constituting an image.

A signal processing device 106 is connected to the signal detection circuits 105 and the scan signal control device 104. The signal processing device 106 performs predetermined processing with respect to the electrical signals that have been detected at the signal detection circuits 105. Further, the signal processing device 106 outputs a control signal that indicates a timing of signal detection to the signal detection circuits 105. Furthermore, the signal processing device 106 outputs a control signal that indicates a timing of output of a scan signal to the scan signal control device 104.

Figure 2:
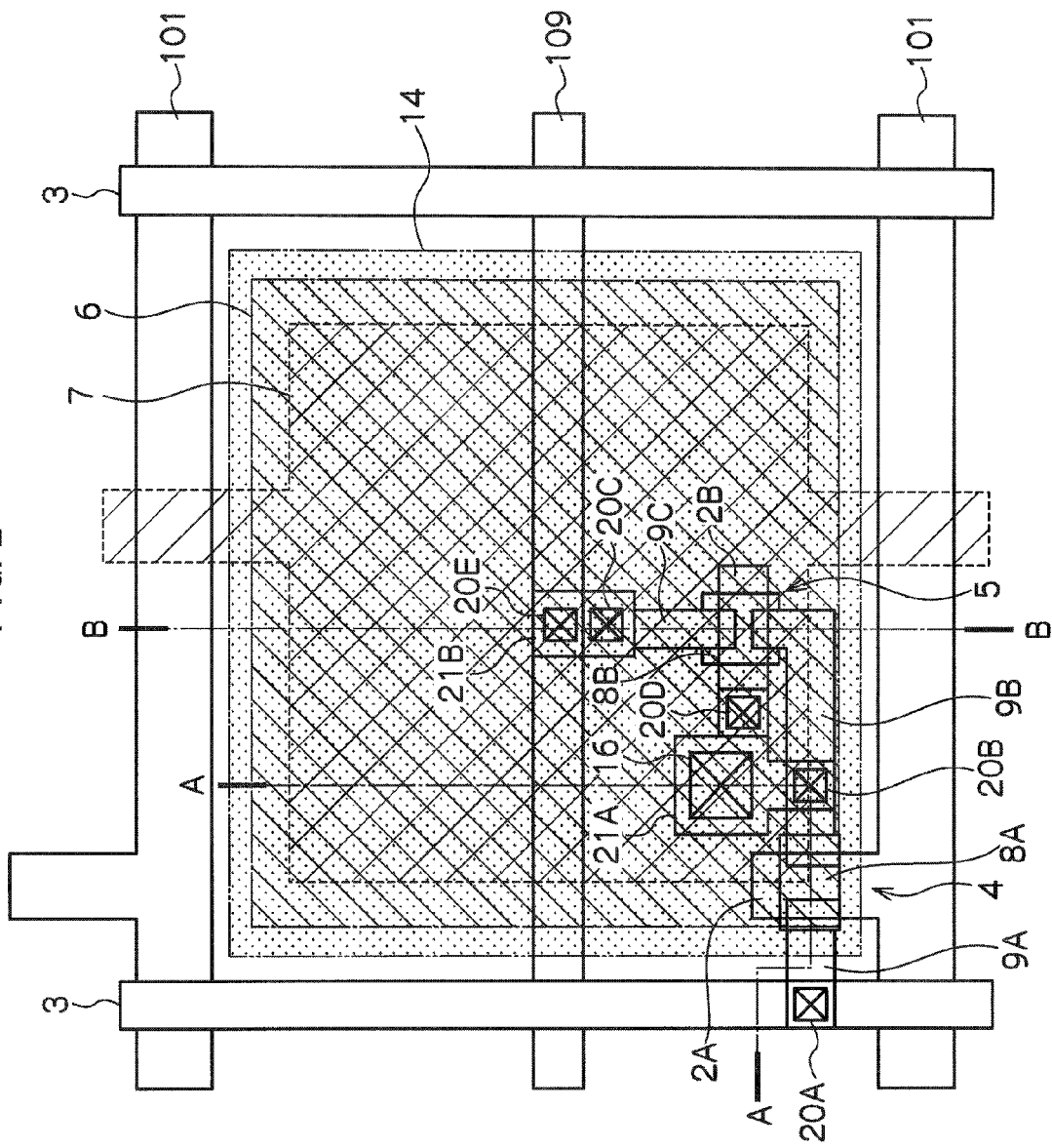
FIG. 2 is a plan view showing a configuration of one pixel unit of a detection element according to an exemplary embodiment.

Next, the detection element 10 according to the present exemplary embodiment will be explained in more detail with reference to FIG. 2, FIG. 3A and FIG. 3B. It should be noted that, FIG. 2 shows a plan view showing a configuration of one pixel unit of the detection element 10 according to the present exemplary embodiment. FIG. 3A shows a cross sectional view along line A-A of FIG. 2. Further, FIG. 3B shows a cross-section view along line B-B of FIG. 2.

As shown in FIG. 3A and FIG. 3B, in the detection element 10, the scan line 101, the second bias line 109, an electrode 2A and an electrode 2B are formed on an insulating substrate 1, which is formed of non-alkaline glass or the like. The electrode 2A operates as a gate of the TFT switch 4. The electrode 2B operates as a gate of the TFT switch 5. The scan line 101 and the electrode 2A are connected to each other (refer to FIG. 2). In the present exemplary embodiment, the second bias line 109 is disposed parallel to the scan line 101. A metal layer in which the scan line 101, the electrodes 2A and 2B, and the second bias line 109 are formed (hereinafter, this metal layer is also referred to as a "first signal wiring layer") is formed by using Al or Cu, or a layered film formed mainly of Al or Cu. However, a material of the metal layer is not limited to these.

On the first signal wiring layer, an insulating film 15 is formed on substantially the entire surface of the region covering the scan line 101, the electrodes 2A and 2B and the second bias line 109. A region of the insulating film 15 that is positioned above the electrode 2A operates as a gate insulating film of the TFT switch 4. A region of the insulating film 15 that is positioned above the electrode 2B operates as a gate insulating film of the TFT switch 5. The insulating film 15 is formed of, for example, $SiN_x$ or the like. The insulating film 15 is formed by, for example, CVD (Chemical Vapor Deposition) film formation.

At positions above the insulating film 15 corresponding to the electrodes 2A and 2B, semiconductor active layers 8A and 8B are respectively formed in an island shape. The semiconductor active layers 8A and 8B are formed of, for example, an amorphous silicon film. The semiconductor active layer 8A is a channel portion of the TFT switch 4. Further, the semiconductor active layer 8B is a channel portion of the TFT switch 5.

At a layer above the respective layers described above, an electrode 9A, an electrode 9B and an electrode 9C are formed. The electrode 9A operates as a source of the TFT switch 4. The electrode 9B operates as a drain of the TFT switch 4 and a drain of the TFT switch 5. The electrode 9C operates as a source of the TFT switch 5. A metal layer in which the electrodes 9A, 9B and 9C are formed (hereinafter, this metal layer is also referred to as a "second signal wiring layer") is also formed by using Al or Cu, or a layered film formed mainly of Al or Cu. However, a material of the metal layer is not limited to these.

Between the electrodes 9A, 9B and 9C and the semiconductor active layers 8A and 8B, a contact layer (not shown) is formed. The contract layer is formed as an impurity-doped semiconductor layer, of impurity-doped amorphous silicon or the like.

Above the second signal wiring layer, a first TFT protection film layer 11A is formed on substantially the entire surface of the region covering the electrodes 9A, 9B and 9C. The first TFT protection film layer 11A is formed of, for example, $SiN_x$ or the like. The first TFT protection film layer 11A is formed by, for example, CVD film formation.

In the first TFT protection film layer 11A, contact holes 20A, 20B and 20C are respectively formed at a position where the signal line 3 and the electrode 9A face each other, a position facing the electrode 9B, and a position facing the electrode 9C (refer to FIG. 2). Further, in the insulating film 15 and the first TFT protection film layer 11A, contact holes 20D and 20E are respectively formed at a position facing the electrode 2B and a position facing the second bias line 109.

At a layer above the first TFT protection film layer 11A, the signal line 3 and contact pads 21A and 21B are formed. The signal line 3 is connected to the electrode 9A via the contact hole 20A. The contact pad 21A is connected to the electrode 9B via the contact hole 20B. Further, the contact pad 21A is connected to the electrode 2B via the contact hole 20D. The contact pad 21B is connected to the electrode 9C via the contact hole 20C. Further the contact pad 21B is connected to the second bias line 109 via the contact hole 20E. A metal layer in which the signal line 3 and the contact pads 21A and 21B are formed (hereinafter, this metal layer is also referred to as a "third signal wiring layer") is also formed using Al or Cu, or a layered film formed mainly of Al or Cu. However, a material of the metal layer is not limited to these. It should be noted that, in the detection element 10 according to the present exemplary embodiment, the contact pads 21A and 21B are formed in a region where a lower electrode 14, which will be described later, has been formed.

Further, at substantially the entire surface (substantially the entire area) of a region on the substrate where pixels have been provided, a second TFT protection film layer 11B is formed, covering the signal line 3 and the contact pads 21A and 21B. The second TFT protection film layer 11B also is formed of, for example, $SiN_x$ or the like. The second TFT protection film layer 11B is formed by, for example, CVD film formation.

A coating-type interlayer insulating film 12 is formed on the TFT protecting film layer 11. The interlayer insulating film 12 is formed to a film thickness of 1 to 4 μm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\in_r=2$ to 4). In the electromagnetic wave detecting element 10 relating to the present exemplary embodiment, the capacity between the metals that are disposed at the upper layer and the lower layer of the interlayer insulating film 12 is kept low by the interlayer insulating film 12. Further, generally, a material such as the above also functions as a flattening film, and also has the effect of flattening the steps of the lower layer. The shapes of semiconductor layer 6 that are disposed at the upper layer are flattened by the interlayer insulating film 12. Therefore, a decrease in the absorption efficiency due to unevenness of the semiconductor layer 6, and an increase in leak current can be suppressed. In the first TFT protection film layer 11A and the second TFT protection film layer 11B, a contact hole 16 is formed at a position facing the contact pad 21A.

On the interlayer insulating film 12, the lower electrode 14 of the sensor portion 103 is formed so as to cover the pixel region while filling in the contact hole 16. The lower electrode 14 is connected with the contact pad 21B. The contact pad 21B connects the drain and the gate of the TFT switch 5. Further, the contact pad 21B also serves as a connection member that electrically connects the lower electrode 14 and the drain of the TFT switch 4.

If the semiconductor layer 6 that will be described later is thick and is around 1 μm, there are hardly any limitations on the material of the lower electrode 14 provided that it is electrically-conductive. Therefore, the lower electrode 14 can be formed by using an electrically-conductive metal such as an Al-type material, ITO (indium tin oxide), or the like.

On the other hand, if the film thickness of the semiconductor layer 6 is thin (around 0.2 to 0.5 μm), the absorption of light at the semiconductor layer 6 is insufficient. In order to prevent an increase in leak current due to the illumination of light onto the TFT switch 4 and 5, it is preferable to make the lower electrode 14 be an alloy or a layered film that is formed including a light-shielding metal.

On the lower electrode 14, the semiconductor layer 6 formed mainly including amorphous silicon and functioning as a photodiode is formed. It should be noted that this expression "mainly including" refers to having a content of amorphous silicon of 70% or more. In the present exemplary embodiment, a photodiode having a PIN structure is employed as the semiconductor layer 6, and it is formed by layering an $n^+$ layer, an i layer and a $p^+$ layer in this order It should be noted that, in the present exemplary embodiment, the lower electrode 14 is made to be larger than the semiconductor layer 6. Further, it should be noted that, if the film thickness of the semiconductor layer 6 is thin (for example, if it is 0.5 μm or less), it is preferable to dispose a light-shielding metal in the lower electrode 14 to cover the TFT switches 4 and 5, in order to prevent incidence of light onto the TFT switches 4 and 5.

Further, in order to suppress the advancing of light into the TFT switch 4 due to irregular reflection of light at the device interior, the interval from the channel portion of the TFT switch 4 to the end portion of the lower electrode 14 that is formed from a light-shielding metal is preferably ensured to be greater than or equal to 5 μm.

On the interlayer insulating film 12 and the semiconductor layer 6, a protective insulating film 17 is formed having an opening at the portions respective to each of the semiconductor layer 6. The protective insulating film 17 is formed of, for example, $SiN_x$ or the like, similarly to the first TFT protection film layer 11A and the second TFT protection film layer 11B. The protective insulating film 17 is formed by, for example, CVD film formation.

On the semiconductor layer 6 and the protective insulating film 17, an upper electrode 7 is formed so as to cover at least the opening portions of the protective insulating film 17. In the upper electrode 7, a material having a high light-transmitting property, such as, for example, ITO, IZO (indium zinc oxide) or the like, is used.

A coating-type interlayer insulating film 18 is formed on the upper electrode 7 and the protective insulating film 17. On the interlayer insulating film 18, the first bias line 107 (not shown) is electrically connected with the upper electrode 7 via a contact portion (not shown in the drawings) provided at the interlayer insulating film 18. The first bias line 107 is formed by Al or Cu, or by an alloy or a layered film formed mainly of Al or Cu. It should be noted that, in the present exemplary embodiment, a portion of the upper electrode 7 is extended along the signal line 3 and connects with the upper electrode 7 of other pixel that are adjacent along the signal line 3. Therefore, in the detection element 10 of the present exemplary embodiment, in a case where a defect in a contact that connects the upper electrode 7 and the first bias line 107 has generated, the bias voltage can be applied to the upper electrode 7 from an adjacent pixel. As a result, the detection element 10 of the present exemplary embodiment can suppress operational defects of the sensor portion 103.

Figure 4:
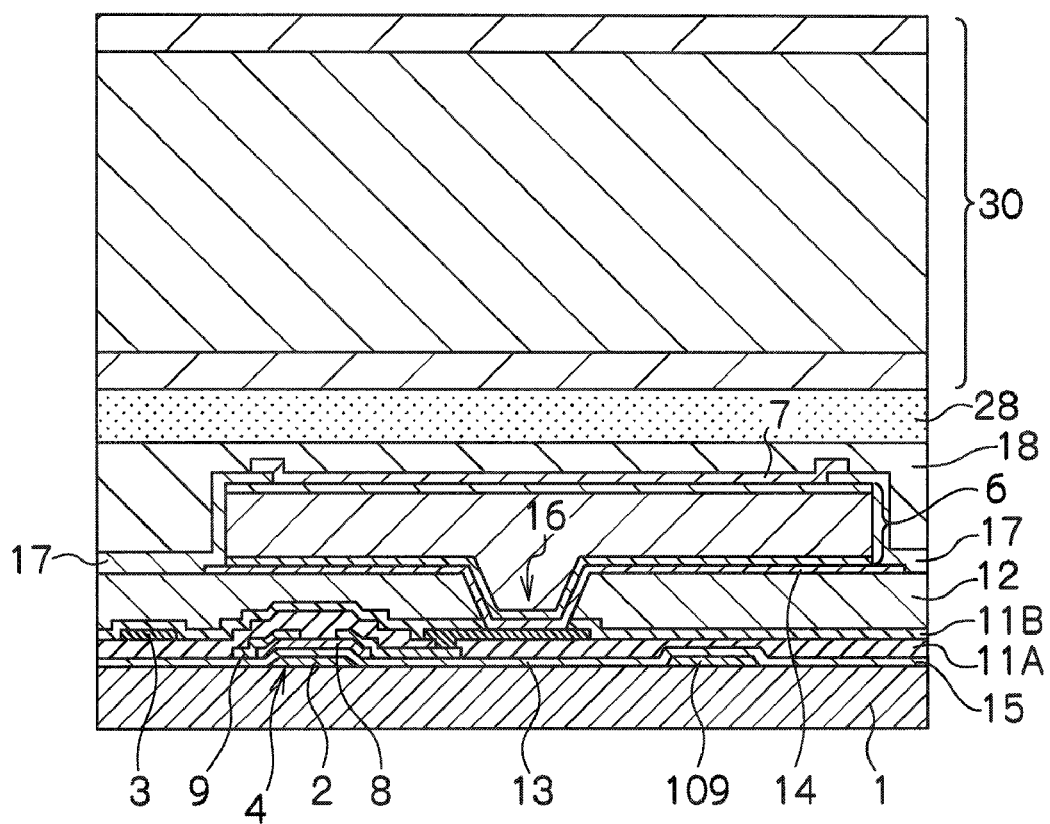
FIG. 4 is a cross-sectional view showing a schematic configuration of a detection element to which a scintillator has been applied according to an exemplary embodiment.

As shown in FIG. 4, in the detection element 10 of the present exemplary embodiment, a scintillator 30, formed of GOS or the like, is applied by using an adhesive resin 28 or the like, having a low light-absorption property.

Figure 5:
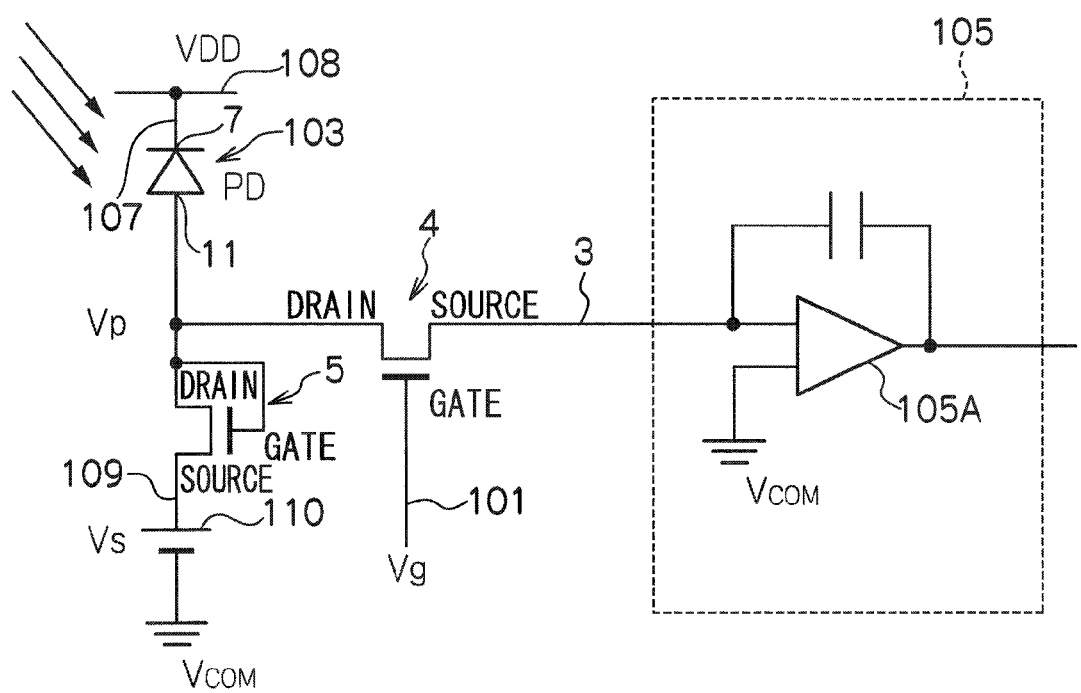
FIG. 5 is an equivalent circuit diagram focusing on one pixel portion of a detection element according to an exemplary embodiment.

In FIG. 5, an equivalent circuit diagram focusing on one pixel portion of the detection element 10 according to the present exemplary embodiment is shown.

As shown in FIG. 5, the source of the TFT switch 4 is connected to the signal line 3. The signal line 3 is connected to a charge amp 105A which is an amplification circuit that is built into the signal detection circuit 105. Further, the drain of the TFT switch 4 is connected to the lower electrode 14 of the sensor portion 103 and the drain of the TFT switch 5. Furthermore, the gate of the TFT switch 4 is connected to the scan line 101.

The charge amp 105A amplifies an electrical signal that flows through the signal line 3, by using a reference voltage Vcom as a reference.

The upper electrode 7 is connected to the first bias line 107, and the bias voltage VDD is applied thereto via the bias.

Further, the source of the TFT switch 5 is connected to the second bias line 109. The source of the TFT switch 5 is supplied with power at the saturation prevention voltage level Vs via the second bias line 109. The gate of the TFT switch 5 is connected to its own drain.

The saturation prevention voltage level Vs is set to a voltage level that is intermediate to the reference voltage Vcom and the bias voltage VDD.

The TFT switch 5 functions as a diode due to the gate and the drain being connected.

Figure 6:
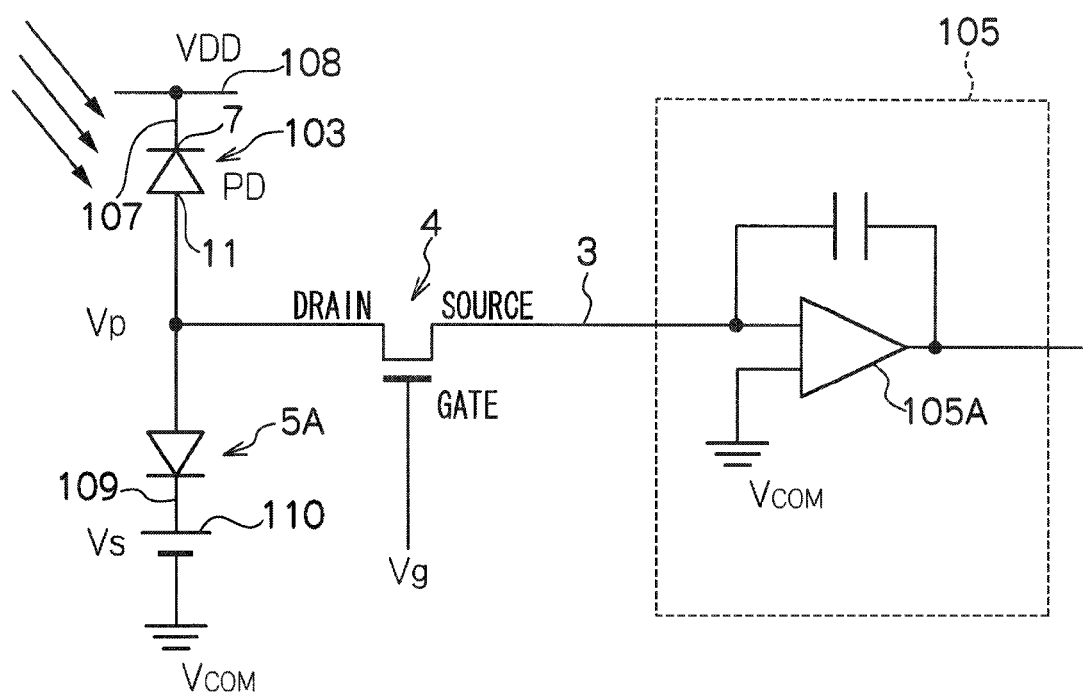
FIG. 6 is an equivalent circuit diagram focusing on one pixel portion of a detection element according to an exemplary embodiment.

In FIG. 6, an equivalent circuit diagram showing the TFT switch 5 of FIG. 5 as a diode 5A is shown.

As shown in FIG. 6, the TFT switch 5 is equivalent to a configuration in which an anode of the diode 5A has been connected to the lower electrode 14 of the sensor portion 103 and a cathode of the diode 5A has been connected to the second bias line 109.

Next, the principles of the operation of the radiographic image detection apparatus 100 including the detection element 10 of the above structure will be explained.

When X-rays are irradiated from above in FIG. 4, the irradiated X-rays are absorbed by the scintillator 30 and are converted to visible light. It should be noted that the X-rays may be irradiated from below in FIG. 4. In this case as well, the X-rays are absorbed by the scintillator 30 and are converted into visible light. The light generated from the scintillator 30 is illuminated onto the semiconductor layer 6 of the sensor portions 103 that are arranged in an array on a TFT array substrate.

At the electromagnetic wave detecting element 10, the semiconductor layer 6 is provided to be separated into the respective pixel units. The predetermined bias voltage VDD is applied to the semiconductor layer 6 from the upper electrode 7 via the first bias line 107. For example, in a case where the semiconductor layer 6 has a PIN structure that is layered in the order of $n^+$, i, $p^+$ ($n^+$ amorphous silicon, amorphous silicon, $p^+$ amorphous silicon) from the lower layer, a bias voltage of negative polarity is applied to the upper electrode 7. On the other hand, in the case of a PIN structure that is layered in the order of $p^+$, i, $n^+$ from the lower layer, a bias voltage of positive polarity is applied to the upper electrode 7. In the present exemplary embodiment, the semiconductor layer 6 has a PIN structure that is layered in the order of $p^+$, i, $n^+$ from the lower layer. Accordingly, in the following, a case where a bias voltage of positive polarity is applied to the upper electrode 7 will be explained.

When light is not illuminated when the bias voltage is applied, a current less than or equal to several to several ten $pA/mm^2$ flows in the semiconductor layer 6. On the other hand, when light is illuminated when the bias voltage is applied, charges are generated, and light current is generated, in the semiconductor layer 6. Positive charges generated at the semiconductor layer 6 are collected by the lower electrode 14. At the time of image detection, negative bias is applied to the gate electrode 2A of the TFT switch 4 and the TFT switch 4 is maintained in an OFF state, and the charges collected by the lower electrode 14 are accumulated.

In the detection element 10 according to the present exemplary embodiment, in accordance with the amount of charges that have been collected and accumulated, the voltage level of the lower electrode 14 increases, and the potential difference between the upper electrode 7 and the lower electrode 14 decreases when the amount of charges collected and accumulated increases. Further, the gate of the TFT switch 4 is maintained in the OFF state. As a result, the charges that have been collected at the lower electrode 14 remain accumulated.

However, in the detection element 10, when the voltage level of the lower electrode 14 becomes the saturation prevention voltage level Vs, the accumulated charges flow out to the second bias line 109 via the diode 5A as an electrical signal. Accordingly, increase in the voltage level of the lower electrode 14 is prevented.

Figure 7:
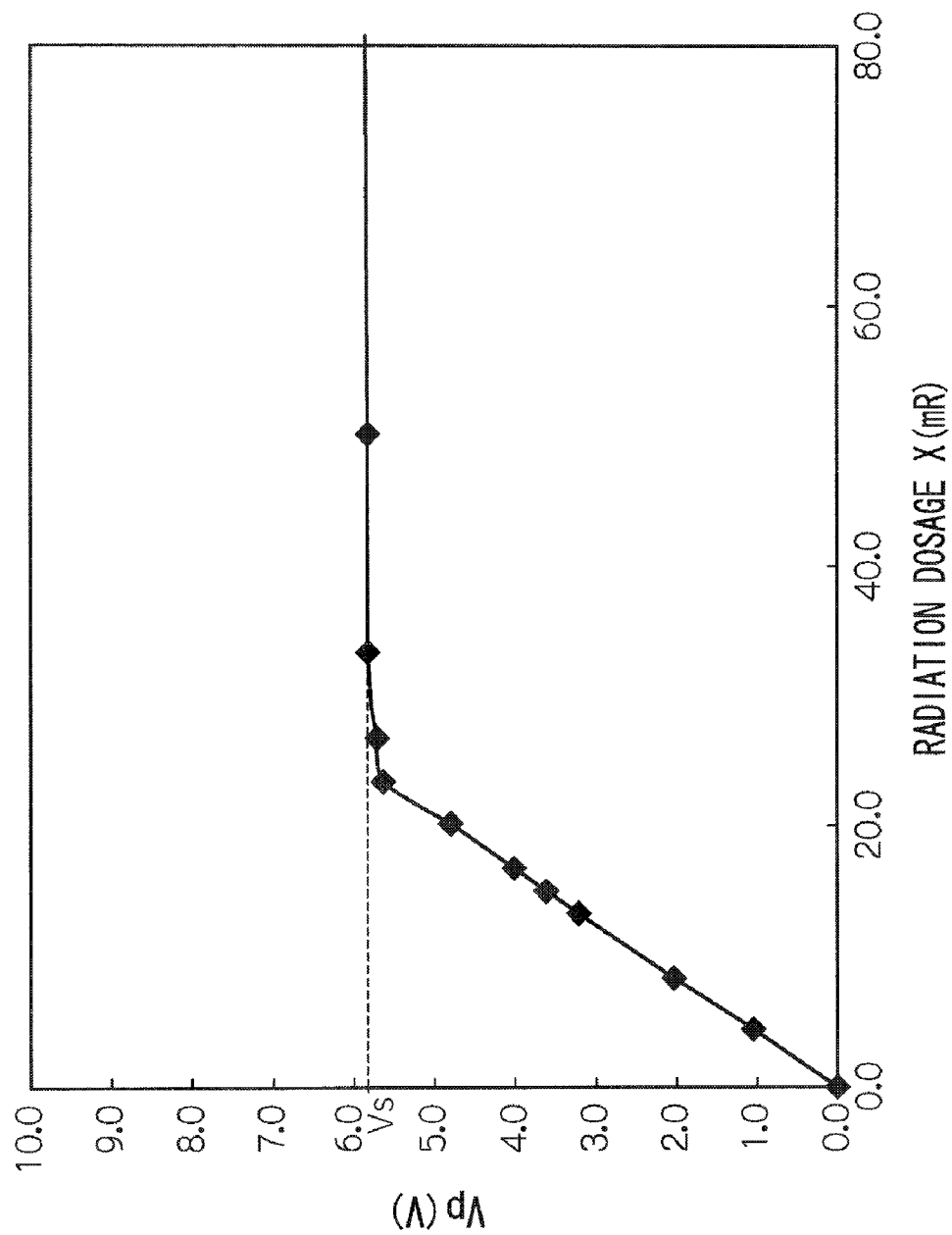
FIG. 7 is a graph showing the relationship between a radiation dosage X of X-rays and a voltage Vp of a lower electrode in a case where X-rays are irradiated to a detection element according to an exemplary embodiment.

In FIG. 7, change in a voltage Vp[V] of the lower electrode 14 with respect to a radiation dosage X[mR] of X-rays in a case where X-rays are irradiated to the detection element 10 according to an exemplary embodiment is shown.

As shown in FIG. 7, the more the irradiated radiation dosage X increases, the more the voltage Vp of the lower electrode 14 increases. However, when the voltage Vp becomes the saturation prevention voltage level Vs, the charges that have been accumulated at the lower electrode 14 flow-out to the second bias line 109 via the diode 5A as an electrical signal. Accordingly, the voltage Vp does not increase over the voltage Vs.

As a result, the voltage Vp of the lower electrode 14 does not reach a saturation voltage at which trapping is generated at the semiconductor layer 6. Therefore, the detection element 10 according to the present exemplary embodiment can suppress generation of a residual image.

Figure 8:
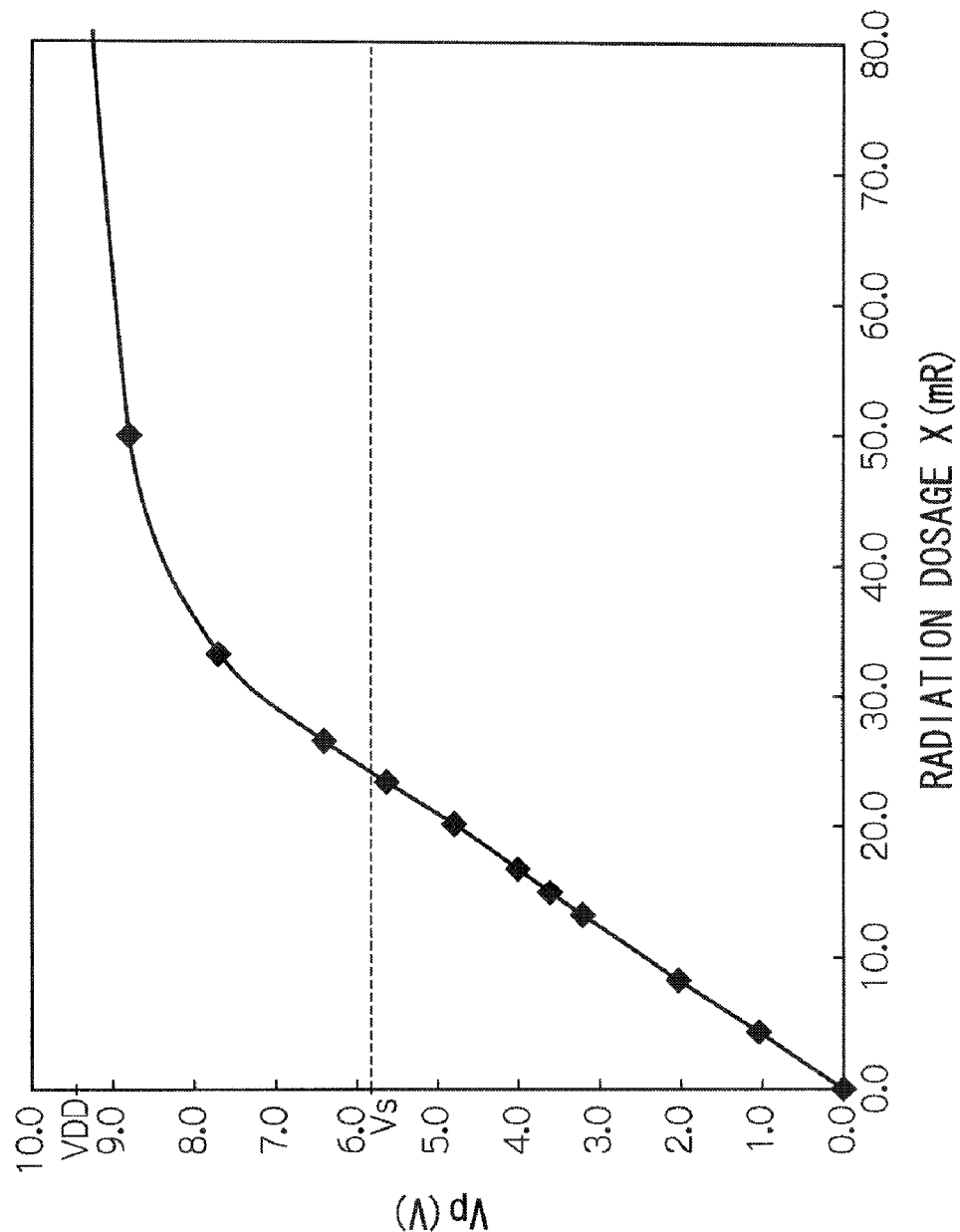
FIG. 8 is a graph showing the relationship between a radiation dosage X of X-rays and a voltage Vp of a lower electrode in a case where X-rays are irradiated to a conventional detection element.
Figure 9:
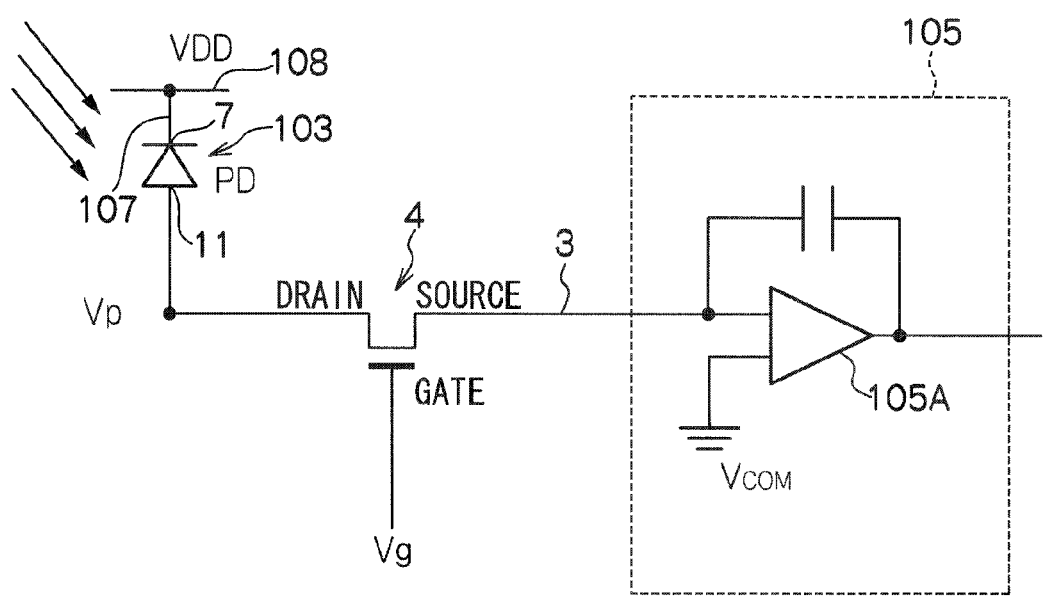
FIG. 9 is an equivalent circuit diagram focusing on one pixel portion of a conventional detection element.

On the other hand, FIG. 8 shows a change in a voltage Vp of the lower electrode 14 with respect to a radiation dosage X of X-rays in a case where X-rays are irradiated to the detection element 10 in which the TFT switch 5 and the second bias line 109 are not provided, as shown in FIG. 9.

As shown in FIG. 8, the voltage Vp of the lower electrode 14 increases when the radiation dosage X increases, and becomes saturated and substantially constant when the voltage Vp becomes a voltage level that is close to that of the bias voltage VDD. As a result, charges that have been generated at the semiconductor layer 6 are trapped by a defect level at the interior of the semiconductor layer 6 without being able to move.

At the time of image read-out, ON signals (+10 to 20V) are successively applied to the electrodes 2A of the TFT switches 4 via the scan lines 101. As a result, due to the TFT switches 4 being successively turned ON, electrical signals corresponding to the charge amounts accumulated at the lower electrodes 14 flow-out to the signal lines 3. On the basis of the electrical signals that have flowed out to the signal lines 3, the signal detection circuits 105 detect the charge amounts that have been accumulated in the respective sensor portions 103 as information of the respective pixels constituting the image. As a result, image information expressing the image that is expressed by the X-rays that are irradiated to the detection element 10, can thereby be obtained.

Next, design values of the diode 5A that is used as a saturation prevention circuit will be explained.

A desired value of the driving ability of the diode 5A is determined according to a sensitivity of the sensor portion 103.

In order to not allow charges generated at the semiconductor layer 6 to be accumulated at the lower electrode 14, it is necessary to make a current amount I_leak, which is an amount that allows the charges to flow-out from the diode 5A, larger than a current amount Ipd, which is an amount that is generated at the semiconductor layer 6. Further, characteristics of a diode ordinarily vary with temperature and changes over time. As a result, it is preferable to have a margin of about tenfold, and I_leak≧10×Ipd becomes a rough guide.

In the radiographic image detection apparatus 100 for still-image photographing, a maximum value of Ipd is about 0.2 nA.

On the other hand, in a case where the diode 5A includes a TFT of amorphous silicon in which W/L=3, I_leak is equal to 0.33 [pA] when Vp−Vs=2. As a result, the current value I_leak, which is an amount that allows the charges to flow-out from the diode 5A, becomes larger than the current value Ipd, which is a value that is supplied from the semiconductor layer 6. Therefore, the detection element 10 according to the present exemplary embodiment can suppress saturation.

Moreover, when Vp−Vs=3 [V], and I_leak is equal to 5.7 [nA], this results in I_leak>10×Ipd, and a sufficient margin can therefore be provided. As a result, the detection element 10 according to the present exemplary embodiment can suppress saturation even better. In this case, if a difference between Vp and Vs of about 3V can be ensured, saturation of the photodiode can be stably suppressed.

As described above, according to the present exemplary embodiment, the detection element 10 is provided with the saturation prevention circuit that prevents the accumulated charges from flowing out when charges that have been generated in the semiconductor layer 6 are collected and the voltage level of the lower electrode 14 has become the saturation prevention voltage level Vs. Due thereto, even when the charges that have been generated at the semiconductor layer 6 have been collected by the lower electrode 14, the voltage level of the lower electrode 14 does not reach a saturation voltage at which trapping is generated at the semiconductor layer 6. Therefore, the detection element 10 according to the present exemplary embodiment can suppress generation of a residual image.

Further, according to the present exemplary embodiment, in a case where the accumulated charge amount increases and the potential difference between the lower electrode 14 and the gate of the TFT switch 4 increases, the charges that have been accumulated at the lower electrode 14 becomes harder to leak from the TFT switch 4. As a result, it is easy for the voltage of the lower electrode 14 to increase. Therefore, according to the present exemplary embodiment, since the leaking of the accumulated charges from the TFT switch 4 becomes harder due to the above mentioned structure, it is possible to realize the effect of providing the saturation prevention circuit. Further, as a result of this, generation of a residual image can be suppressed.

Further, in the present exemplary embodiment, the contact pads 21A and 21B are formed at a metal layer at a downstream side, from the lower electrode 14, with respect to light illuminated onto the semiconductor layer 6 from the scintillator 30. Accordingly, light illuminated onto the semiconductor layer 6 is not shielded by the contact pads 21A and 21B. Further, in the present exemplary embodiment, the contact pads 21A and 21B are formed in a region where the lower electrode 14 is formed. Therefore, reduction of an area of a light-receiving region (a so-called fill factor) of the semiconductor layer 6 due to the contact pads 21A and 21B can be suppressed.

It should be noted that, in the above exemplary embodiment, a case has been explained in which the lower electrode 14 and the drain of the TFT switch 4 are connected, the gate and the drain of the TFT switch 5 are connected, and the source of the TFT switch 5 and the second bias line 109 are connected, by the contact pads 21A and 21B. However, the present invention is not limited thereto. The electrodes 9A, 9B and 9C of the second signal wiring layer may be extended to connect the aforementioned combinations.

Figure 10:
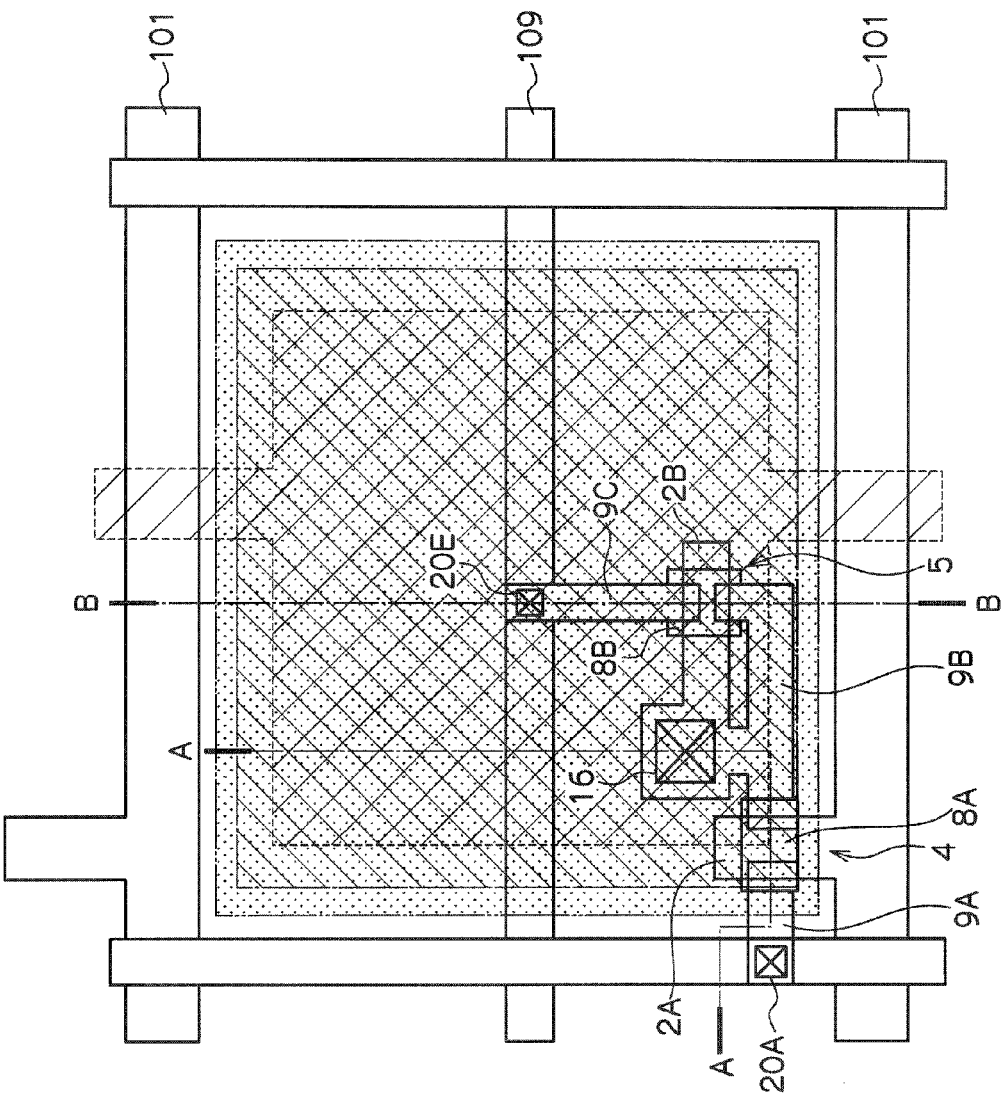
FIG. 10 is a plan view showing a configuration of one pixel unit of a detection element according to another exemplary embodiment.

FIG. 10 shows a plan view showing the structure of one pixel unit of the detection element 10 in the above-mentioned case, where the electrodes 9A, 9B and 9C are extended. FIG. 11A shows a cross-sectional view along line A-A of FIG. 10. Further, FIG. 11B shows a cross-sectional view along line B-B of FIG. 10.

Further, in the above exemplary embodiment, a case has been explained in which the second bias line 109 is provided parallel to the scan line 101. However, the present invention is not limited thereto. The second bias line 109 may be formed parallel to the signal line 3.

FIG. 12 shows a plan view showing the structure of one pixel unit of the detection element 10 in a case where the second bias line 109 is formed parallel to the signal line 3. FIG. 13A shows a cross-sectional view along line A-A of FIG. 12. Further, FIG. 13B shows a cross-sectional view along line B-B of FIG. 12.

In this regard, as shown in FIG. 12, FIG. 13A and FIG. 13B, the second bias line 109 is formed parallel to the signal line 3 in the second signal wiring layer and is connected with the electrode 9C. According to the above configuration, the signal line 3 does not cross the second bias line 109, and increase in electrostatic capacity of the lines due to the signal line 3 crossing with the second bias line 109 can be prevented. As a result, in the present exemplary embodiment, electrical noise generated at the signal line 3 can be reduced. Further, the second bias line 109 is formed in a different metal layer (in this case, the second signal wiring layer) from the signal line 3. Accordingly, yield reduction due to a leak between the signal line 3 and the second bias line 109 can be suppressed.

Further, in the above exemplary embodiment, a case has been explained in which the first bias line 107 is provided in an upper layer from the semiconductor layer 6. However, the present invention is not limited thereto. The first bias line 107 may be provided in a lower layer from the semiconductor layer 6.

Figure 14:
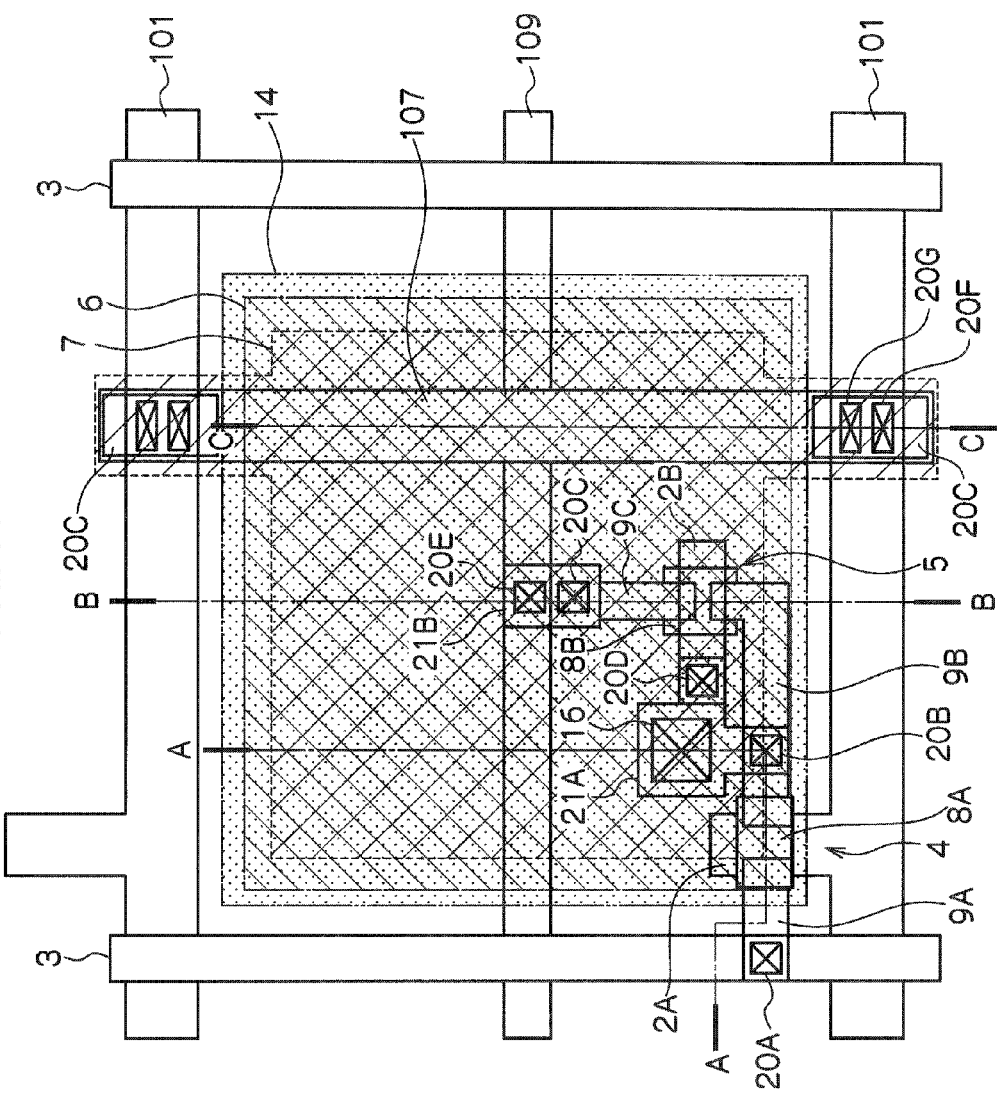
FIG. 14 is a plan view showing a configuration of one pixel unit of a detection element according to another exemplary embodiment.
Figure 15:
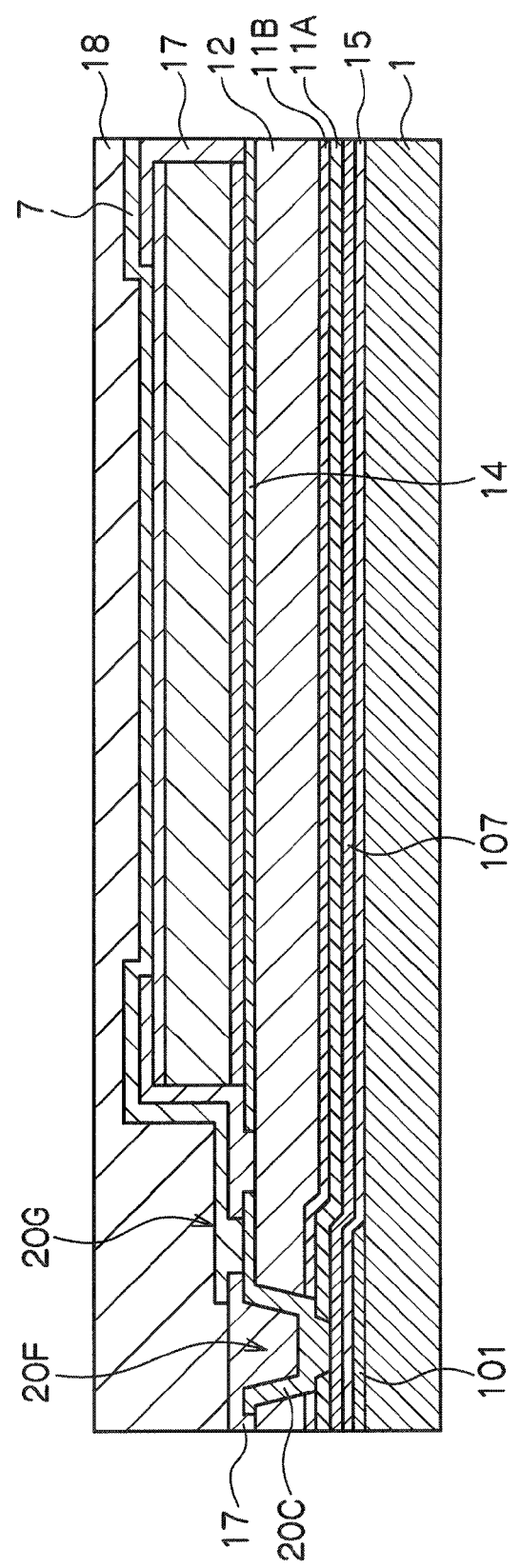
FIG. 15 is a cross-sectional view of one pixel unit of a detection element according to another exemplary embodiment.

FIG. 14 shows a plan view showing the structure of one pixel unit of the detection element 10 in a case where the first bias line 107 is formed in a lower layer from the semiconductor layer 6. Further, FIG. 15 shows a cross-sectional view along line C-C of FIG. 14. It should be noted that, a cross-sectional view along line A-A of FIG. 14 is the same structure as in FIG. 3A. Further, a cross-sectional view along line B-B of FIG. 14 is the same structure as in FIG. 3B.

As shown in FIG. 15, a configuration may be provided wherein the first bias line 107 is formed in the second signal wiring layer, which is a lower layer from the semiconductor layer 6, and the first bias line 107 and the upper electrode 7 are connected by a contact pad 21C via contact holes 20F and 20G. By forming the first bias line 107 at a lower layer side from the semiconductor layer 6 in this manner, X-rays that are irradiated from above in FIG. 15 are not shielded by the first bias line 107. Accordingly, reduction in a fill factor of the semiconductor layer 6 can be suppressed.

Further, in the present exemplary embodiment, a case has been explained in which the present invention is applied to the detection element 10 that detects an image by detecting X-rays as the radiation serving as a detection subject. However, the present invention is not limited thereto. For example, the radiation serving as the detection subject may be gamma rays or the like.

Aside from this, the configuration of the radiographic image detection apparatus 100 (refer to FIG. 1) and the configuration of the detection element 10 (FIG. 2 to FIG. 4, and FIG. 11 to FIG. 15) that have been explained in the present exemplary embodiment are one example. It goes without saying that appropriate modifications are possible within a range that does not depart from the gist of the present invention.

What is claimed is:

1. A detection element comprising:
   a light emitting layer that emits light due to radiation being irradiated thereto;
   a semiconductor layer that generates charges due to incident light from the light emitting layer;
   a first electrode that applies a bias voltage to the semiconductor layer;
   a second electrode that collects charges generated at the semiconductor layer, and in which a voltage level changes so that a potential difference between the second electrode and the first electrode decreases when a charge amount of charges collected and accumulated increases; and
   a saturation prevention circuit connected to the second electrode, and through which the accumulated charges flow when the voltage level of the second electrode reaches a predetermined saturation prevention voltage level having the same polarity as the bias voltage and having an absolute value of the voltage level smaller than the voltage level of the bias voltage.

2. The detection element of claim 1, further comprising:
   a signal line connected to the second electrode via a switch element, and through which an electrical signal corresponding to the accumulated charges flows in accordance with a switching state of the switch element; and
   an amplification circuit that amplifies the electrical signal that flows through the signal line, by using a predetermined reference voltage as a reference,
   wherein the saturation prevention voltage level is a voltage level between the reference voltage and the bias voltage.

3. The detection element of claim 2, wherein:
   the switch element is a thin film transistor; and
   a potential difference between a gate of the thin film transistor and the second electrode increases when the accumulated charge amount increases.

4. The detection element of claim 1, wherein the saturation prevention circuit comprises:
   a power line to which power at the saturation prevention voltage level is supplied; and
   a diode in which a cathode is connected to the power line, and an anode is connected to the second electrode.

5. The detection element of claim 4, wherein the diode comprises a thin film transistor in which a gate and a drain are connected.

6. The detection element of claim 5, wherein:
   the diode is configured such that the gate and the drain of the thin film transistor are electrically connected by a first connection member; and
   the first connection member is formed at a metal layer different from the gate and the drain of the thin film transistor and from the second electrode, and is at a downstream side, from the second electrode, with respect to the incident light.

7. The detection element of claim 6, wherein the first connection member electrically connects the second electrode and the switch element.

8. The detection element of claim 6, wherein the power line and the cathode of the diode are electrically connected by a second connection member formed at the same metal layer as the first connection member.

9. The detection element of claim 8, wherein the first connection member and the second connection member are formed in a region where the second electrode is formed.

10. A detection element comprising:
    a semiconductor layer that is formed with amorphous silicon as a main constituent thereof and generates charges due to incident light;
    a first electrode that applies a bias voltage to the semiconductor layer;
    a second electrode that collects charges generated at the semiconductor layer, and in which a voltage level changes so that a potential difference between the second electrode and the first electrode decreases when a charge amount of charges collected and accumulated increases; and
    a saturation prevention circuit connected to the second electrode, and through which the accumulated charges flow when the voltage level of the second electrode becomes a predetermined saturation prevention voltage level having the same polarity as the bias voltage and having an absolute value of the voltage level smaller than the voltage of the bias voltage.

11. The detection element of claim 10, further comprising:
    a signal line connected to the second electrode via a switch element, and through which an electrical signal corresponding to the accumulated charges flows in accordance with a switching state of the switch element; and an amplification circuit that amplifies the electrical signal that flows through the signal line, by using a predetermined reference voltage as a reference, wherein the saturation prevention voltage level is a voltage level between the reference voltage and the bias voltage.

12. The detection element of claim 11, wherein:

the switch element is a thin film transistor; and a potential difference between a gate of the thin film transistor and the second electrode increases when the accumulated charge amount increases.

13. The detection element of claim 10, wherein the saturation prevention circuit comprises:

a power line to which power at the saturation prevention voltage level is supplied; and a diode in which a cathode is connected to the power line, and an anode is connected to the second electrode.

14. The detection element of claim 13, wherein the diode comprises a thin film transistor in which a gate and a drain are connected to each other.

15. The detection element of claim 14, wherein:

the diode is configured such that the gate and the drain of the thin film transistor are electrically connected by a first connection member; and the first connection member is formed at a metal layer different from the gate and the drain of the thin film transistor and from the second electrode, and is at a downstream side, from the second electrode, with respect to the incident light.

16. The detection element of claim 15, wherein the first connection member electrically connects the second electrode and the switch element.

17. The detection element of claim 15, wherein the power line and the cathode of the diode are electrically connected by a second connection member formed at the same metal layer as the first connection member.

18. The detection element of claim 17, wherein the first connection member and the second connection member are formed in a region where the second electrode is formed.

* * * * *